(12) United States Patent
Kashyap et al.

(10) Patent No.: US 9,767,231 B2
(45) Date of Patent: Sep. 19, 2017

(54) METHOD AND SYSTEM FOR CALCULATING AFFINITY BETWEEN ENTITIES USING ELECTRICAL CIRCUIT ANALOGY

(71) Applicants: Ajay Kashyap, Roorkee (IN); Sundara Raghavan Sankaran, Chennai (IN)

(72) Inventors: Ajay Kashyap, Roorkee (IN); Sundara Raghavan Sankaran, Chennai (IN)

(73) Assignee: CRAYON DATA PTE. LTD, Singapore (SG)

( * ) Notice: Subject to any disclaimer, the term of this patent is extended or adjusted under 35 U.S.C. 154(b) by 169 days.

(21) Appl. No.: 14/633,539

(22) Filed: Feb. 27, 2015

(65) Prior Publication Data

US 2016/0246901 A1 Aug. 25, 2016

(51) Int. Cl.
*G06F 17/50* (2006.01)
*G06F 17/30* (2006.01)

(52) U.S. Cl.
CPC .... *G06F 17/5009* (2013.01); *G06F 17/30958* (2013.01)

(58) Field of Classification Search
CPC ......... G06F 17/30864; G06F 17/30958; G06F 17/30

USPC ......................................... 716/136
See application file for complete search history.

(56) References Cited

U.S. PATENT DOCUMENTS

2013/0060640 A1* 3/2013 Gadhia et al. ............. 705/14.58
2016/0247175 A1* 8/2016 Milton ............... G06Q 30/0205

* cited by examiner

*Primary Examiner* — Suchin Parihar

(57) ABSTRACT

Methods and systems for measuring relatedness, known as net affinity, between any two arbitrary nodes, known as entities, in a graph is provided. According to one embodiment, unprocessed data about entities is collected from various data sources. The unprocessed data is transformed to a graph with entities as nodes and corresponding direct affinities between them as edges. Depending on relationship between corresponding nodes, the corresponding edges are at least one of non-directed, directed and temporal. The graph is simulated as an electrical circuit with non-directed edges as a conventional resistor. The directed edges are simulated as at least one of a conventional resistor coupled with a forward-biased ideal diode in direction of the directed edges. The temporal edges are simulated with a time-delay circuit involving, at least in part, a capacitor. Further, relatedness between all pairs of nodes is calculated in accordance with the rules of electrical circuit topology.

11 Claims, 7 Drawing Sheets

METHOD AND SYSTEM FOR CALCULATING AFFINITY BETWEEN ENTITIES USING ELECTRICAL CIRCUIT ANALOGY

FIELD OF THE INVENTION

The present invention relates to a recommender system and a method of generating computer-implemented recommendations. More specifically, the invention relates to calculation of relatedness between entities using electrical circuit analogy.

BACKGROUND OF THE INVENTION

Owing to the rapid development of the Internet, people are confronted with abundant online content, which makes it very time-consuming to select the needed information. The biggest challenge faced by most users/customers is the explosion of choices due to more and varied sources of information, higher number of devices, increase in real-time data, higher transparency and the rise of social media.

This is often referred to as the information overload problem. In order to solve it, recommender systems are widely investigated and applied to real systems. Recommender systems could be used for recommending choices to users in areas such as retail, media, sales and marketing, telecom, hospitality etc. They provide personalized choices to users by predicting their potential interests based on their historical choices. However, recommender systems in general face a variety of problems, such as:

Sparse data: In many large-scale applications, both number of items and number of consumers are large. If C denotes set of consumers and I denotes set of items, consumer-product interaction matrix could be represented by a |C|×|I| matrix R=(rij), such that rij=k, k=1 . . . 5, if user I rated item j, =0, Otherwise In such cases, even when many events have been recorded, the consumer-product interaction matrix can still be extremely sparse, that is, there are very few elements in R whose value is not 0. This problem, commonly referred to as sparsity problem, has a major negative impact on effectiveness of methods to form associations between users/products. Because of sparsity, it is highly probable that similarity (or correlation) between two given users is zero, rendering many algorithms such as collaborative filtering, content-based analysis, spectral analysis etc. ineffective or partially effective, at best. Even for pairs of users that are positively correlated, such correlation measures may not be reliable. Further, forming associations between entities is sometimes difficult due to lack of availability of data when there is a variation in factors such as cost, location and availability of the entities. For instance, a product may belong to the same segment or category of products, however, they may have vastly different costs.

Directionality in choices: Predictability is a binary relationship with a direction attached to it i.e., it is between a pair of entities and is directed from the first one in the pair to the second. It is thus important to note that it is not a symmetric relationship i.e., if entity 'A' is associated to entity 'B', it does not mean that entity 'B' could also be associated to entity 'A' in a similar manner. To quote a more real world example, a person who has bought a car is likely to buy an accessory to it, not the other way round. Many collaborative filtering and content-based recommender systems fail to take directionality into account.

Time gap in choices: Due to the time gap between actions of user, there is a gap in availability of information. Such situations usually arise in case when a user performs an action after a fixed period of time, thus creating more data points for improvement in recommendation system, which could not have been possible at the time of performing the first action.

Till now, many recommendation algorithms such as collaborative filtering (CF), content-based analysis and spectral analysis, have been proposed. Matrix factorization algorithms have also been widely investigated by combining high scalability with predictive accuracy. Recommender systems represent consumer statistics as user or item graphs to study similarities and co-occurrences of entities in the statistical data. These user or item graphs illustrate consumer taste and behavior across various entities. Further, graph traversal methods are used to study these user or item graphs. More recently, some physical processes including mass diffusion, heat conduction, hydraulic flow and electric circuit analysis have been applied to design recommendation algorithms.

A paper 'Identifying and Characterizing Key Nodes among Communities Based on Electrical-Circuit Networks' by Fenghui Zhu (hereby noted as Zhu) discloses a method for simulating directed and non-directed networks using electrical component analysis. This paper proposes a method for simulating the non-directed network by placing a resistor with a specific electrical conductance at each of the edge of the non-directed network and for simulating a directed network by placing a diode with at each edge of the directed network. Further, using the laws of electric circuit topology, the effective affinity between any two nodes is calculated. The paper doesn't solve the problem of time gap in choices discussed above. Also, it seems to be limited in its applicability as it focuses mostly on product-user matrix and on the other hand the net affinity algorithm can be used even for attribute-user matrices.

Similarly, 'Measuring User Similarity Using Electric Circuit Analysis: Application to Collaborative Filtering' by Joonhyuk Yang uses the laws of electric circuit topology to calculate effective affinity between any two nodes. This paper further promotes the use of circuit elements such as capacitors and inductors for future use in simulating other types of graphs. Even though it envisions potential use of capacitors in future for circuit modeling, it suffers from the same problems contained in Zhu.

Techniques similar to the above prior arts have been discussed in multiple papers such as 'Measuring and Extracting Proximity Graphs in Networks', 'Estimation from Relative Measurements: Error Bounds From Electrical Analogy' and 'Electricity Based External Similarity of Categorical Attributes'. However, all of them are limited in their approach to just focusing on conductance relationships rather than temporal factors. They do not address effectively the core issues discussed above such as sparse data and time-gap between the choices.

Thus, there exists a need for an improved recommender system algorithm for recommending exhaustive, relevant and personalized choices to users without being limited by issues such as scarcity of available data. Further, there is a need for developing recommendation systems that could solve the problems in availability of data arising due to time gap of choices.

SUMMARY OF THE INVENTION

The present invention provides a method, system and software for calculating net affinity between entities in an affinity graph using electrical circuit analogy.

The present invention implements electrical circuit analogy for calculating three types of affinities, such as non-directed, directed and temporal affinities between any two entities. Raw data about entities is collected from various sources. The raw data is used to determine direct affinities between the entities. The direct affinity between two entities is at least one of non-directed, directed and temporal affinity. An affinity graph is then created with entities as nodes and corresponding direct affinities between them as edges. The edges between two nodes could be of three types, such as non-directed edge, directed edge and temporal edge, each representing non-directed, directed and temporal affinity between the entities. One or more edges between two nodes in the affinity graph represent one or more types of direct affinities between the respective entities. Now, this affinity graph is simulated as an electrical circuit. During this simulation, the non-directed edges are represented by a conventional resistor: the directed edges are represented by at least one of a conventional resistor coupled with a forward-biased ideal diode in the direction of the directed edges and the temporal edges are represented by a time-delay circuit involving, at least in part, a capacitor. Now, net affinity between any two entities in the affinity graph is calculated in accordance with the rules of electrical circuit topology.

DETAILED DESCRIPTION OF THE INVENTION

Described herein are methods, computer systems and software for calculating net affinity between entities in an affinity graph using electrical circuit analogy in accordance with the present invention. The following detailed description of the invention refers to the accompanying drawings.

Figure 1:
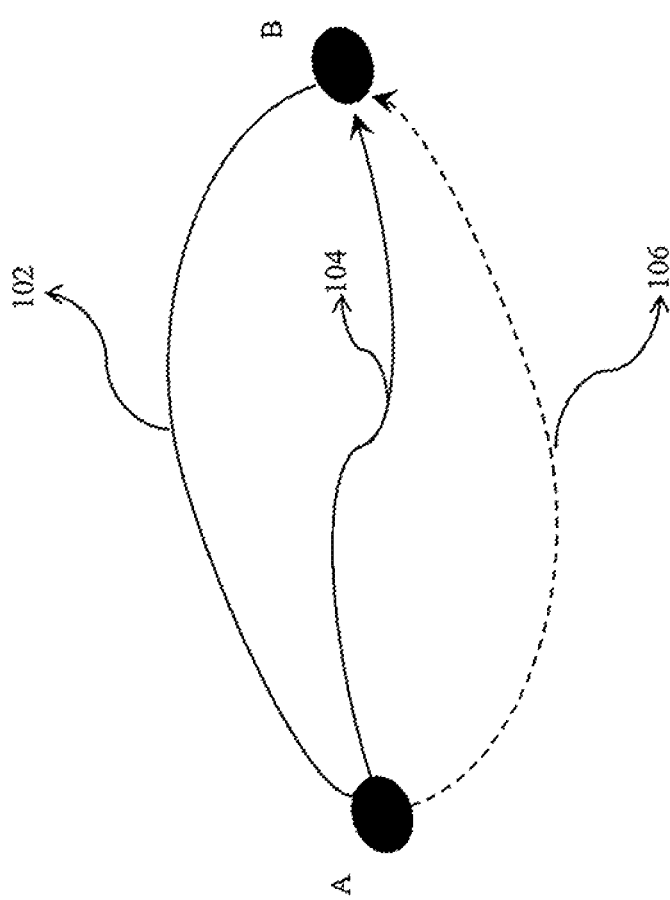
FIG. 1 illustrates three types of affinities between two entities.

Affinity is a measure of relatedness between two entities. In accordance with the present invention, affinities between two entities could be at least one of non-directed affinity, directed affinity or temporal affinity. Further, two entities may be associated by more than one type of affinity. FIG. 1 illustrates the three types of affinities between two entities. 102, 104 and 106 represent three types of affinities between two entities, A and B.

Empirical formulae could be used for determining the three types of affinities between two entities.

102 represents non-directed affinity between the entities A and B. Non-directed affinity, also known as mutual non-directed affinity between two entities indicates the likelihood to select an entity if the other one of the two entities is selected. For example, in a retail scenario, the non-directed affinity 102 between product A and B indicates the likelihood of purchasing product A if product B is purchased, and vice versa. Higher this likelihood, higher would be the non-directed affinity.

Following are some of the features of non-directed affinity:

Higher the number of people who like both entities together, higher is the non-directed affinity;

Higher the percentage of people who like both entities, as against total number of people who like any product, higher is the non-directed affinity;

Higher the value of non-directed affinity, lower should be the respective resistance in electrical circuit analogy;

Non-directed affinity is symmetrical to both the entities.

After taking the above features into consideration, empirical formulae could be derived for determining non-directed affinity between two entities. Following is an example of formula for calculating non-directed affinity MAB between two entities A and B:

$$MAB = \frac{n_{AB}^2}{n_A \times n_B}$$

wherein $n_{AB}$ is the number of people buying/reviewing/liking/selecting entities A and B together, $n_A$ is the number of people buying/reviewing/liking/selecting entity A and $n_B$ is the number of people buying/reviewing/liking/selecting entity B. In case where the entities are attributes of items/people/prospects, the $n_{AB}$, $n_A$ and $n_B$ could correspond to the number of items/people/prospects possessing the respective attributes. The numbers $n_{AB}$, $n_A$ and $n_B$ could be determined from raw data including, but not limited to sales invoices, customer loyalty data, review data, cookie data, credit card data and social media data.

Similarly, other empirical formulae could be derived for determining non-directed affinity between two entities.

104 represents directed affinity between the entities A and B. Directed affinity between two entities indicates the additional likelihood of selecting an entity provided the other entity has been selected. For example, in a retail scenario, directed affinity 104 from product A to B is the likelihood of purchasing B, provided A has been purchased. Directed affinity is dependent on the direction, i.e. directed affinity between A and B is not same as that between B and A.

Following are some of the features of directed affinity:

Directed affinity represents directionality, i.e. it measures the difference between percentages of people who like one of the two entities, as against total number of people who like both the two entities. Higher this difference, higher is the magnitude of directional affinity Higher is the magnitude of directional affinity, lower should be the respective resistance in electrical circuit analogy In order to represent directed affinity as combination of diode and resistor in electrical circuit analogy, the value of directed affinity is positive in one direction and 0 in the opposite direction After taking the above features into consideration, empirical formulae could be derived for determining directed affinity between two entities. Following is an example of formula for calculating directed affinity DAB between two entities A and B:

$$DAB = \text{Max}\left(0, \left(\frac{n_{AB}}{n_A} - \frac{n_{AB}}{n_B}\right)\right)$$

wherein, $n_{AB}$ is the number of people buying/reviewing/liking/selecting entities A and B together, $n_A$ is the number of people buying/reviewing/liking/selecting entity A and $n_B$ is the number of people buying/reviewing/liking/selecting entity B. In case where the entities are attributes of items/people/prospects, the $n_{AB}$, $n_A$ and $n_B$ could correspond to the number of items/people/prospects possessing the respective attributes. The numbers $n_{AB}$, $n_A$ and $n_B$ could be determined from raw data including, but not limited to sales invoices, customer loyalty data, review data, cookie data, credit card data and social media data.

Similarly, other empirical formulae could be derived for determining directed affinity between two entities.

106 represents temporal affinity between the entities A and B. Temporal affinity 106 between two entities indicates the time duration for selecting an entity after the other entity has been selected. For example, in retail scenario, temporal affinity from product A to B is the time duration after which B is purchased following the purchase of product A. Temporal affinity is a directional metric, i.e. time delay between purchases of products A and B is not same as that between B and A.

Following are some of the features of temporal affinity:

Temporal affinity represents time delay of buying one entity after another one. Hence, its value should be positive in one direction and zero in opposite direction Temporal affinity represents time difference, i.e. higher the typical time difference for customers buying the two products, higher is the magnitude of temporal affinity Temporal affinity could be represented by one of weighted average, maximum time gap or minimum time gap depending on application After taking the above features into consideration, empirical formulae could be derived for determining temporal affinity between two entities. Following is an example of formula for calculating temporal affinity TAB between two entities A and B:

$$TAB = \text{Max}(0, (T_B - T_A))$$

wherein, $T_B$ is the average of all time instances when entity B is purchased/reviewed/liked/selected and $T_A$ is the average of all time instances when entity A is purchased/reviewed/liked/selected. $T_B$ and $T_A$ could be determined from raw data including, but not limited to sales invoices, customer loyalty data, review data, cookie data, credit card data and social media data.

Similarly, other empirical formulae could be derived for determining temporal affinity between two entities.

Figure 2:
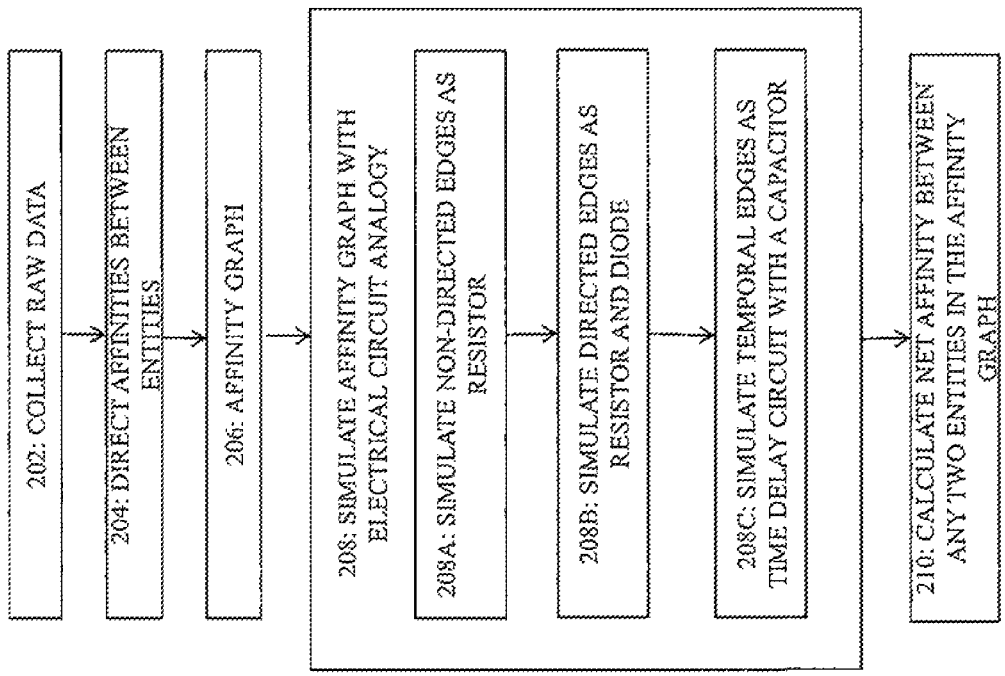
FIG. 2 is a flow chart of the steps performed in accordance with the present invention.

FIG. 2 discloses a flow diagram in accordance with various steps executed by method and system in accordance with the present invention. At step 202, raw data regarding entities is collected. The entities could include but are not limited to products, movies, books, musical compositions, hotels, restaurants, television shows, events, deals and business prospects or their respective attributes. The raw data about these entities could include, but is not limited to sales invoices, customer loyalty data, review data, cookie data, credit card data, social media data etc. At step 204, the raw data is used to determine direct affinities between the entities. The direct affinities determined at the step 204 are at least one of directed affinity, non-directed affinity and temporal affinity between any two entities. At step 206, an affinity graph is created with entities as nodes and corresponding affinities between the entities as edges. The edges between two entities could be of three types, such as non-directed edge, directed edge and temporal edge, each representing non-directed, directed and temporal affinity between the entities. One or more edges between two nodes in the affinity graph represent one or more types of direct affinities between the respective entities. At step 208, the affinity graph created with the three types of direct affinities between entities is simulated using electrical circuit analogy. At step 208A, non-directed edges are simulated as conventional resistors with resistance values in accordance with the respective non-directed affinity values. At step 208B, directed edges are simulated as combinations of conventional resistors with ideal forward-biased diodes, with resistance of the resistors in accordance with the respective directed affinity values and direction of ideal forward-biased diodes in accordance with direction of the directed edge. At step 208C, temporal edges are simulated as time delay circuits, each time delay circuit comprising at least a capacitor, with value of capacitance in accordance with the respective duration of time delay. An electrical circuit simulating the affinity graph is thus obtained. At step 210, net affinity values are calculated between any two nodes in the graph using the rules of electrical circuit topology. Effective electrical circuit between any two nodes represents the net non-directed, directed and temporal affinities between the two respective entities.

Thus, present invention provides improvement over prior art in a number of ways. It takes into account three different types of affinities between entities, i.e. non-directed, directed and temporal affinities, in a single affinity graph. This helps in analyzing three kinds of affinities between entities and takes into account instances related to directionality and time gap between entities. Further, the present invention simulates the three types of affinities using electrical circuit topology and calculates net affinities between any two entities using the effective electrical circuit between the respective nodes. Implementation of electrical circuit topology for calculation of net affinity helps to overcome constraints of sparse data due to cost, location or lack of availability of data.

FIG. 3 further illustrates net affinity calculation algorithm in accordance with the present invention. FIG. 3(A) illustrates an affinity graph 300A between entities A, B, C and D. The affinity graph 300A is created from direct affinities between entities A, B, C and D, wherein the direct affinities are calculated using the raw data related to these entities. The entities A, B, C and D could include but are not limited to products, movies, books, musical compositions, hotels, restaurants, television shows, events, deals, business prospects and their respective attributes. Further, the raw data about the entities A, B, C and D could include, but is not limited to sales invoices, customer loyalty data, review data, cookie data, credit card data, social media data etc. Nodes 310, 320, 330, 340 in the affinity graph 300A represent entities A, B, C and D respectively. Edges 312A, 314A and 316A between the nodes 310 and 320 represent non-directed affinity MAB, directed affinity DAB and temporal affinity TAB, respectively, between entities A and B. Similarly, edges 322A, 324A and 326A represent the respective affinities between entities B and C and edges 332A, 334A and 336A represent the respective affinities between entities C and D.

Figure 3A:
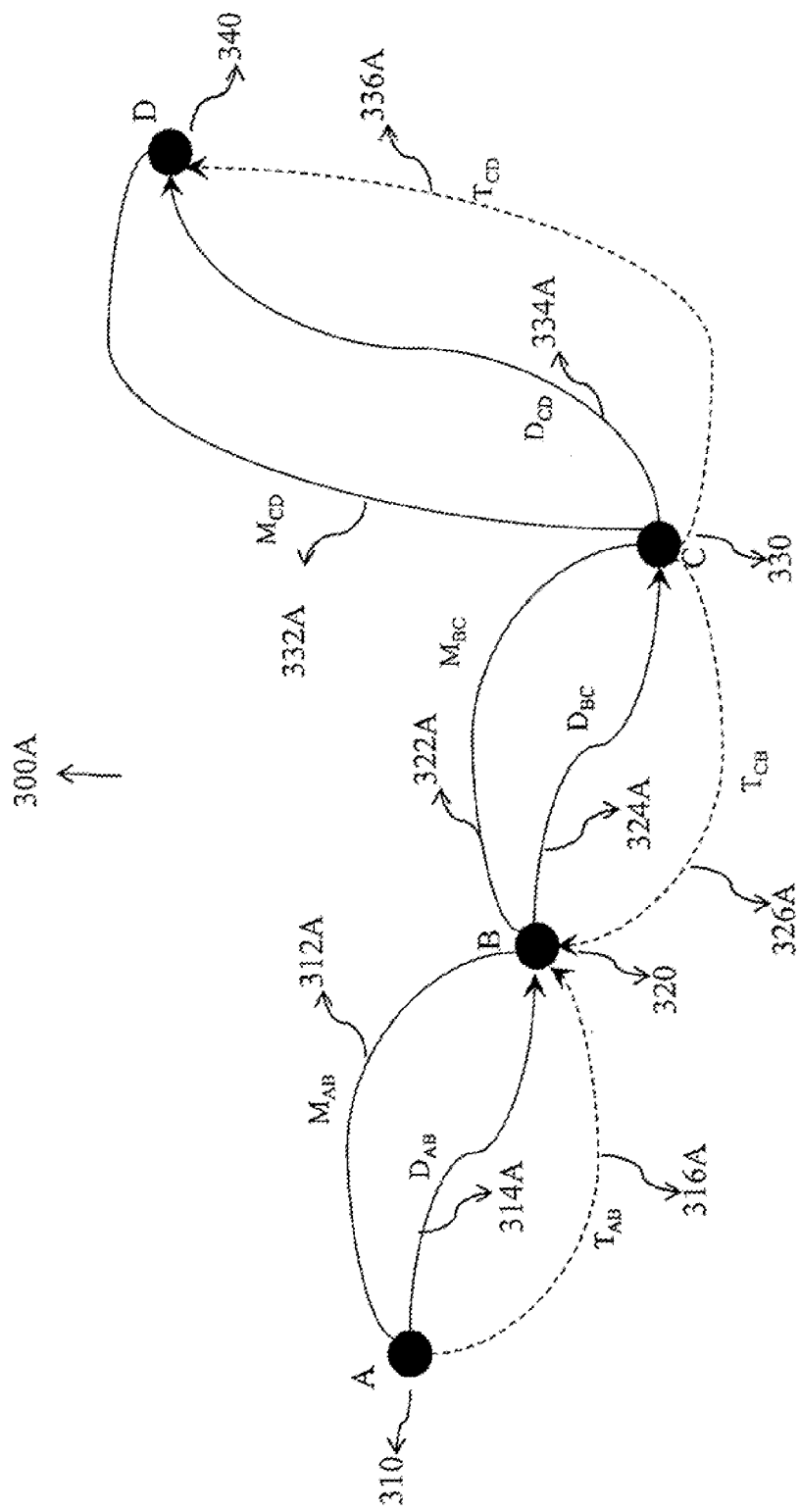
FIGS. 3 A-D illustrates net affinity calculation between two nodes in affinity graph using electrical circuit topology in accordance with the present invention.
Figure 3B:
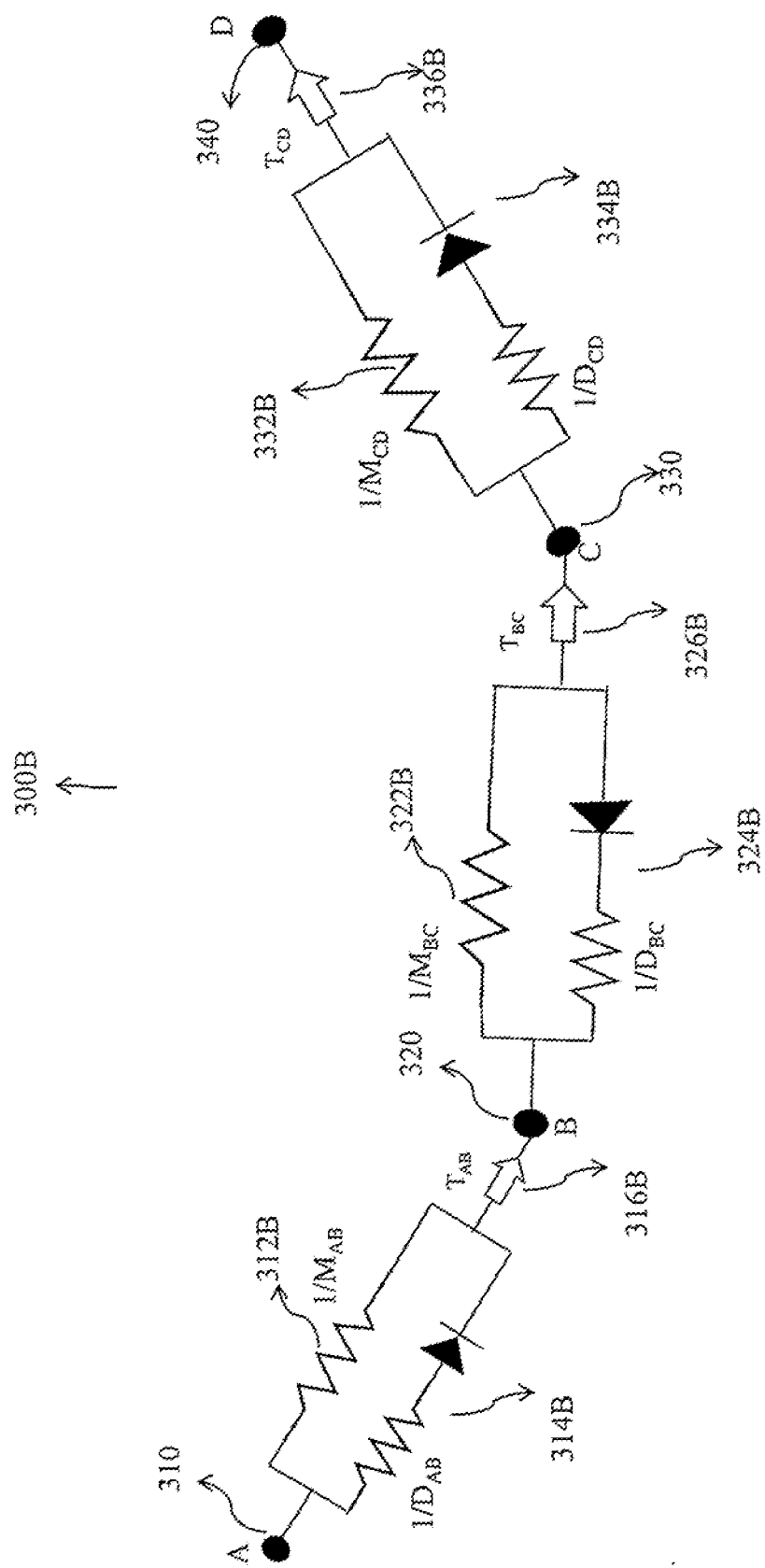

FIG. 3(B) illustrates an electrical circuit 300B as the simulation of the affinity graph 300A illustrated in FIG. 3(A). The nodes 310, 320, 330 and 340 in the affinity graph 300A in FIG. 3(A) are simulated as nodes in electrical circuit 300B in FIG. 3(B). The edges 312A, 322A and 332A representing non-directed affinities between respective nodes in FIG. 3(A) are simulated as conventional resistors with resistance values corresponding to the respective non-directed affinity values between the respective entities in FIG. 3(B).

For example, edge 312A corresponding to non-directed affinity of value MAB between entities A and B in FIG. 3(A) is simulated as a conventional resistor 312B of resistance value $$\frac{1}{M_{AB}}$$

between nodes 310 and 320 in FIG. 3(B). Similarly, edges 322A and 332A in FIG. 3(A) are simulated as resistors 322B and 332B with resistance values $$\frac{1}{M_{BC}} \text{ and } \frac{1}{M_{CD}}$$

respectively, between the respective nodes in FIG. 3(B). The edges 314A, 324A and 334A representing directed affinities between respective nodes in FIG. 3(A) are simulated as a combination of conventional resistors with ideal forward-biased diodes in FIG. 3(B). For example, edge 314A in FIG. 3(A) is simulated as 314B, a combination of a conventional resistor with an ideal forward-biased diode in FIG. 3(B). The resistance value of the conventional resistor in 314B is determined to be $$\frac{1}{D_{AB}},$$

in accordance with the value of directed affinity DAB between entities A and B. The ideal forward-biased diode in 314B conducts in direction corresponding to the direction of directed affinity between A and B. Similarly, edges 324A and 334A in FIG. 3(A) are simulated as 324B and 334B respectively, as combinations of conventional resistors with ideal forward-biased diodes, ideal forward-biased diodes conducting in the direction of directed affinity between the respective nodes in FIG. 3(B). The edges 316A. 326A and 336A representing temporal affinities between the respective nodes in FIG. 3(A) are simulated as time delay circuits 316B, 326B and 336B in electrical circuit FIG. 3(B). The values of time delay and the direction of time delay is determined by the temporal affinity between the two nodes. For example, edge 316A in FIG. 3(A) is simulated as time delay circuit 316B in FIG. 3(B) with value of time delay TAB and direction from node 310 to 320, in accordance with the temporal affinity TAB between entities A and B. Similarly, values of time delay and direction of time delay circuits 326B and 336B in FIG. 3(B) are determined by the respective values and directions of temporal affinities TBC and TCD. Electrical circuit 300B in FIG. 3(B) thus represents the affinity graph 300A in FIG. 3(A) using electrical circuit analogy.

Figure 3C:
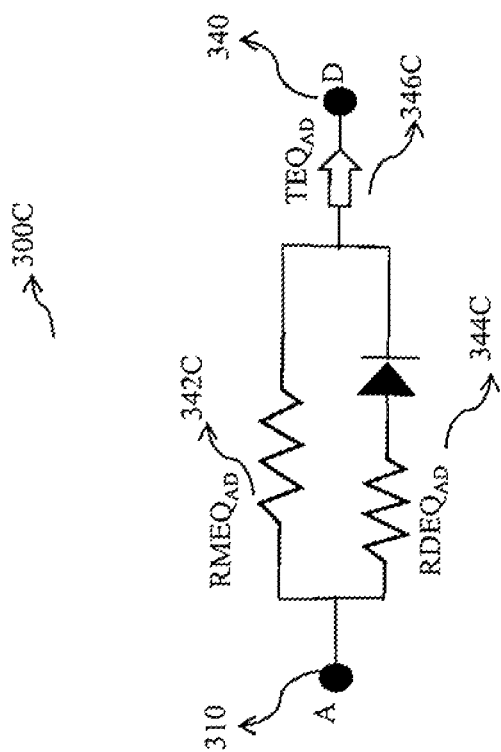

FIG. 3(C) illustrates equivalent circuit between nodes 310 and 340, determined from electrical circuit 300B in FIG. 3(B). 342C, 344C and 346C represent the effective electrical circuit components between edges 310 and 340. The effective resistance RMEQAD in 342C represents net non-directed affinity between entities A and D. Similarly effective resistance RDEQAD in 344C and direction of ideal forward-biased diode in 344C represent the net directed affinity between entities A and D. Further, direction and effective value of time delay TEQAD in 346C represents net temporal affinity between entities A and D. Time delay TEQAD in 346C is a function of time taken by an electric pulse to reach D from A. This function could be equivalent to, but not limited to maximum time taken across all routes, minimum time taken across all routes or weighted average of time taken across all routes.

Figure 3D:
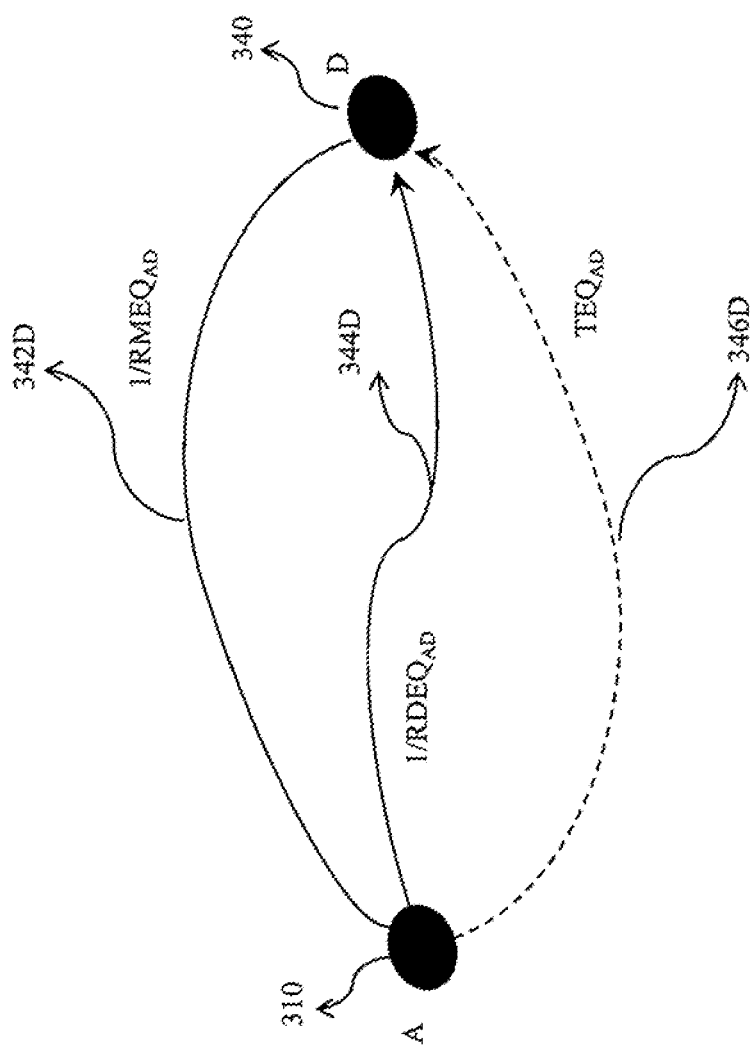

FIG. 3(D) illustrates the three types of net affinity values between entities A and D, represented by the equivalent electrical circuit 300C in FIG. 3(C). The value of non-directed affinity 342D between A and D is determined to be 1/RMEQAD, in accordance with the value of equivalent resistance 342C in FIG. 3(C). Similarly, value of net directed affinity between A and D, 344D is determined to be 1/RDEQAD, in accordance with equivalent resistance in 344C in FIG. 3(C). The direction of 344D is determined by the direction of ideal forward biased diode in 344C in FIG. 3(C). Further, the value of net temporal affinity between A and D, 346D is TEQAD, in accordance with the value of time delay in 346C in FIG. 3(C). Thus, the three types of net affinities between any two nodes in the affinity graph can be calculated using the effective electrical circuit between the two nodes. It should be noted that the affinity graph could consist of more number of nodes and the electrical circuit topology may be extended to affinity graph with higher number of nodes in a similar manner.

The net affinity calculation algorithm using electrical circuit topology could be implemented in a recommender system for recommending limited, relevant and personalized choices to users. The recommender system could implement collaborative filtering, content based filtering or a combination of these two for recommending choices to the users.

Figure 4:
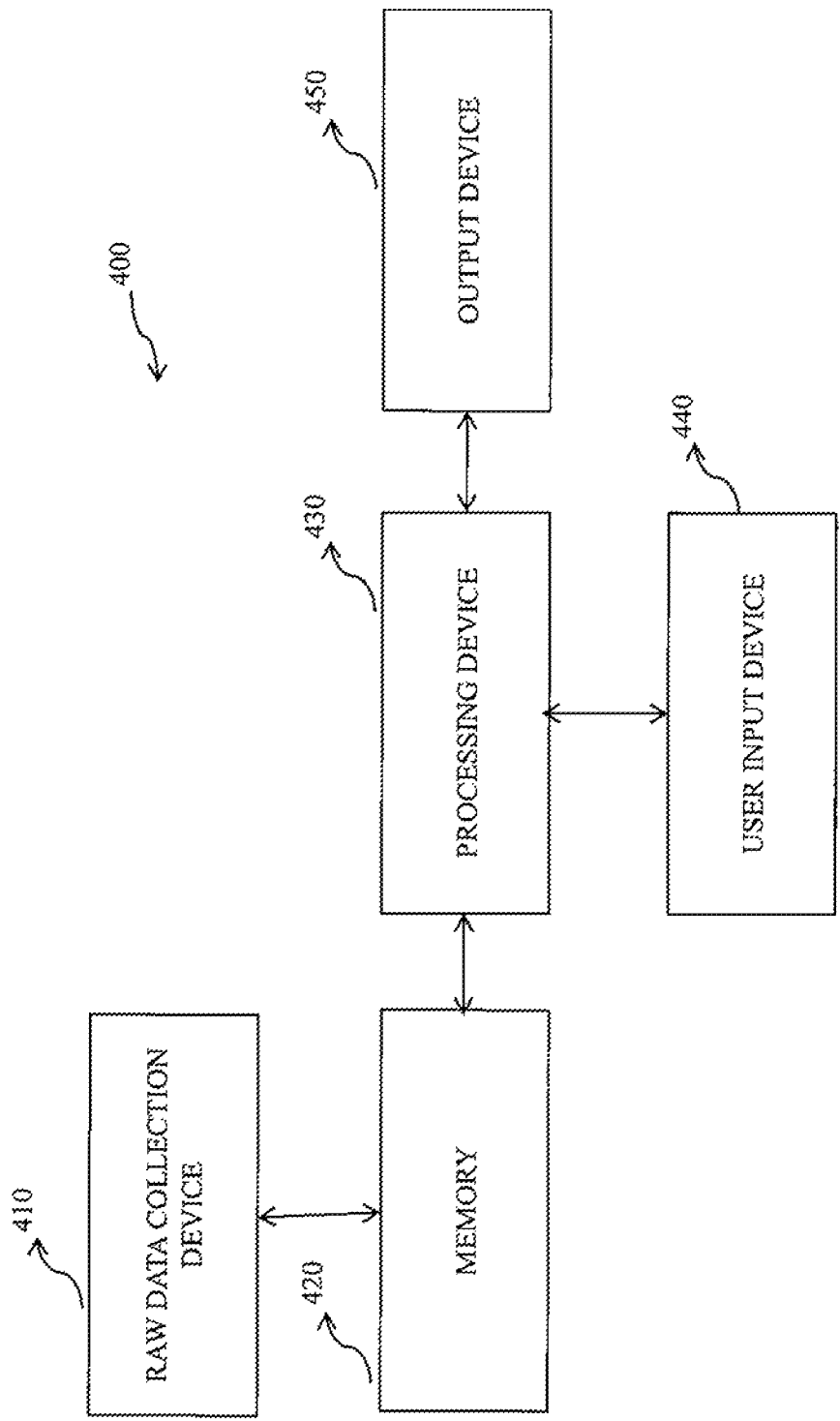
FIG. 4 depicts a recommender system for implementing net affinity calculation in accordance with the present invention.

FIG. 4 discloses a block diagram illustrating a recommender system in which the net affinity algorithm in accordance with the present invention may be implemented. The system 400 comprises a raw data collection device 410, which collects raw data including, but not limited to sales invoices, customer loyalty data, review data, cookie data, credit card data, social media data etc. The raw data collection device 410 could be a computer, central processing unit (CPU), processor, microprocessor, controller enabled with memory or a combination of these. The raw data collection device 410 could further include software or programmed code for enabling raw data collection. Further, the raw data collection device 410 could be connected to a communication network including, but not limited to Internet, Ethernet, Local Area Network (LAN), and Wide Area Network (WAN). The raw data collection device 410 is coupled to a memory device 420.

The raw data collected by the raw data collection device 410 is stored in the memory 420. The received raw data could be stored in a structured or non-structured format in memory 420. The memory 420 could further store algorithm for receiving data, processing data, set of attributes for data, feedbacks received from user, user input data, past recommendation results. The memory 420 could be a RAM, ROM, hard disk, server or any other storage memory known in the art.

A processing device 430 is coupled to the memory 420 and receives the raw data stored in the memory. The processing device 430 could be a computer, server, processor. CPU, or a combination thereof, enabled with software for implementing algorithm in accordance with the present invention.

After receiving the raw data from memory 420, the processing device 430 determines three types of direct affinities between the entities, such as non-directed, directed and temporal affinities, using the raw data. The processing device 430 further creates an affinity graph with entities as nodes and edges between them representing the respective non-directed affinity, directed affinity or temporal affinities. Then, the processing device 430 simulates the affinity graph using electrical circuit topology.

During simulation of the affinity graph as electrical circuit, non-directed edges are simulated as conventional resistors with resistance values in accordance with the respective non-directed affinity values, directed edges are simulated as combinations of conventional resistors with ideal forward-biased diodes, with resistance of the resistors in accordance with the respective directed affinity values and temporal edges are simulated as time delay circuits, each time delay circuit comprising at least a capacitor, with capacitance values in accordance with the respective durations of time delay. After simulating the affinity graph as an electrical circuit, net affinity between any two nodes is calculated by the processing device 430 by determining the effective electrical circuit between the two nodes.

Thus, the three types of net affinities between any two nodes in the affinity graph can be calculated using the effective electrical circuit between the two nodes. The processing device 430 can now determine choices to be recommended to the user by taking into account data relevant to the user together with the net affinities between the different entities in the affinity graph. The data relevant to the user could include but is not limited to user profile, preferences, interests, purchases, reviews, likes, location, behavior, time, For example, entities having high affinity with the entities liked by the user could be recommended to the user by taking into account non-directed, directed or temporal nature of the respective affinities.

The system 400 could additionally include a user input device 440 to take inputs from the user regarding user's preference. The user input device 440 could also take inputs related to filters associated with the category of products or items that the user wants. The user input device 440 could be a computer, portable computer such as laptop, mobile handset, personal data assistant such as tablet. The user input device 440 could further be enabled by software for assisting input of data by the user. The choices for recommendation determined by the processing device 430 may be displayed to the user in decreasing order of relevance through an output device 450. The output device 450 could be display device such as computer, portable computer such as laptop, mobile handset, personal data assistant such as tablet.

According to one aspect of the invention, recommender system 400 disclosed in FIG. 4 is used in hospitality industry for recommending restaurants as choices to customers staying in hotels. Customer reviews on restaurants and social media likes related to restaurants are received as raw data. Further, affinity graph is created with restaurants as nodes and respective affinities between them as edges. The edges could be of three types such as non-directed, directed and temporal affinities. Net affinity algorithm in accordance with the present invention is used to determine net affinity scores between all pairs of restaurants. Further, customer input is received in form of restaurants he likes. The restaurants input by the customer may be located at customer's home city or other places not in the vicinity of the hotel. Further, customer could input his/her preferences or desired attributes for the restaurants. Customer's social media information, location, date and time could also be received as input, given his/her explicit permissions. The recommender system then selects restaurants for recommendation by taking into account the input provided by the customer and net affinity scores for the restaurants.

According to another aspect of the invention, recommender system 400 disclosed in FIG. 4 is used in banking industry for recommending merchants as choices to bank's customers. Credit card transaction data related to merchants is received as raw data. Further, affinity graph is created with merchants or deals offered by merchants as nodes and respective affinities between them as edges. The edges could be of three types such as non-directed, directed and temporal affinities. Net affinity algorithm in accordance with the present invention is used to determine net affinity scores between all pairs of merchants. Further, customer input is received in form of his/her credit card transactions. Further, customer could input his/her preferences or desired attributes along with social media information, location, date and time. The recommender system then selects merchant offers for recommendation by taking into account the input provided by the customer and net affinity scores for the merchants.

According to another aspect of the invention, the recommender system 400 disclosed in FIG. 4 is used in telecom industry for recommending media items for download to the customers. Consumer browsing history in form of cookies is received as raw data. Further, affinity graph is created with media items as nodes and respective affinities between them as edges. The edges could be of three types such as non-directed, directed and temporal affinities. Net affinity algorithm in accordance with the present invention is used to determine net affinity scores between all pairs of media items. Further, customer input is received in form of his/her browsing history or media purchase history. Further, customer could input his/her media preferences or desired attributes along with social media information, location, date and time. The recommender system then selects media items for recommendation by taking into account the input provided by the customer and net affinity scores for the media items.

According to another aspect of the invention, the recommender system 400 disclosed in FIG. 4 is used in retail industry by retailers for recommending products to the customers. Consumer loyalty cards and sales invoices of retailer are received as raw data input. Further, affinity graph is created with products offered by retailer as nodes and respective affinities between them as edges. The edges could be of three types such as non-directed, directed and temporal affinities. Net affinity algorithm in accordance with the present invention is used to determine net affinity scores between all pairs of products. Further, customer input is received in form of his/her past transactions, browsing history. Further, customer could input items in his/her shopping cart, taste preferences or desired product categories along with social media information, location, date and time. The recommender system then selects products for recommendation by taking into account the input provided by the customer and net affinity scores for the products.

According to another aspect of the invention, the recommender system 400 disclosed in FIG. 4 is used for recommending business prospects to the customers. Profile data, financial data, public news, hiring activity, social media activity related to various companies as business prospects are received as raw data input by the recommender system 400. Further, affinity graph is created with attributes of prospects as nodes and respective affinities between them as edges. The edges could be of three types such as non-directed, directed and temporal affinities. Net affinity algorithm in accordance with the present invention is used to determine net affinity scores between all pairs of attributes. Further, customer input is received in form of current clientele data. The recommender system then selects prospects for recommendation by taking into account the input provided by the customer and net affinity scores for the prospects.

According to another aspect of the invention, the recommender system 400 disclosed in FIG. 4 could be used by media companies for recommending TV shows to customers, consumer companies for recommending lifestyle choices to customers or by advertising companies for selecting personalized and relevant advertisements for customers.

The embodiments in accordance with the present invention can be implemented with any combination of hardware and software. If implemented as a computer-implemented apparatus, the present invention can be implemented using means for performing all of the steps and functions described above.

Although the description above illustrates the present invention with many specific examples, these should not be construed as limiting the scope of the invention but as merely illustrating some of the presently preferred embodiments of this invention. Thus, the scope of the invention should be determined by the appended claims and any and all equivalents thereof, rather than by the examples given. It should be understood that various changes and substitutions could be made herein without departing from the spirit and scope of the invention.

What is claimed is:

1. A system for calculating affinities between any two nodes in a graph, the system comprising:
    a data receiving device for receiving raw data in relation to various entities from various data sources;
    at least one processor coupled to a memory, the processor executes an algorithm for:
        receiving raw data in relation to various entities from various data sources;
        transforming the received raw data to, a graph with entities as nodes and corresponding affinities between the entities as edges between the nodes, wherein the affinities are at least one of non-directed, directed and temporal in accordance with the received raw data;
        simulating the graph as an electrical circuit based on a predetermined set of steps, wherein the predetermined set of steps comprises of at least one of the following:
        simulating the non-directed edges as a conventional resistor;
        simulating the directed edges as at least one of a conventional resistor coupled with a forward-biased ideal diode in the direction of the directed edges;
        simulating the temporal edges as a time-delay circuit involving, at least in part, a capacitor;
        calculating net affinity between any two nodes in accordance with rules of electrical circuit topology.

2. The system described in claim 1, wherein the received raw data is restaurant review data and entities are restaurants.

3. The system described in claim 1, wherein the received raw data is sales invoices and loyalty cards data and entities are products sold by the retailers.

4. The system described in claim 1, wherein the received raw data is consumer transaction data provided by banks and entities are merchants.

5. The system described in claim 1, wherein the received raw data is consumer browsing history and entities are media items.

6. The system described in claim 1, wherein the received raw data is profile data, financial data, public news, hiring activity, social media activity related to various business prospects and entities are attributes of business prospects.

7. The system described in claim 1, wherein the entities are one of products, movies, books, musical compositions, hotels, restaurants, television shows, events, deals, business prospects and their attributes.

8. The system described in claim 1, wherein the raw data is one of sales, invoices, transaction data, customer loyalty data, review data, consumer browsing history, cookie data and social media data.

9. The system described in claim 1, wherein one or more edges between two nodes represent one or more types of affinities between two entities.

10. The system described in claim 1 further comprises a user input receiving device for receiving at least one user input.

11. A non-transitory computer medium configured to store executable program instructions, which, when executed by an apparatus, cause the apparatus to calculate affinities between any two nodes in a graph when at least one computer processor of the apparatus performs the steps of:
    receiving raw data in relation to various entities from various data sources;
    transforming the received raw data to a graph with entities as nodes and corresponding affinities between the entities as edges between the nodes, wherein the affinities are at least one of non-directed, directed and temporal in accordance with the received raw data;
    simulating the graph as an electrical circuit based on a predetermined set of steps, wherein the predetermined set of steps comprises of at least one of the following:
    simulating the non-directed edges as a conventional resistor;
    simulating the directed edges as at least one of a conventional resistor coupled with a forward-biased ideal diode in the direction of the directed edges;
    simulating the temporal edges as a time-delay circuit involving, at least in part, a capacitor;
    calculating net affinity between any two nodes in accordance with rules of electrical circuit topology.

* * * * *